(12) United States Patent
Nakamura et al.

(10) Patent No.: US 6,781,158 B2
(45) Date of Patent: Aug. 24, 2004

(54) LIGHT EMITTING ELEMENT AND METHOD FOR MANUFACTURING THEREOF

(75) Inventors: Akio Nakamura, Annaka (JP); Masayuki Shinohara, Annaka (JP); Masahisa Endo, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 96 days.

(21) Appl. No.: 10/131,076

(22) Filed: Apr. 25, 2002

(65) Prior Publication Data

US 2002/0158264 A1 Oct. 31, 2002

(30) Foreign Application Priority Data

Apr. 27, 2001 (JP) ........................................ 2001-133247

(51) Int. Cl.[7] .......................... H01L 33/00; H01L 29/06
(52) U.S. Cl. ........................ 257/94; 257/101; 257/102; 257/94; 257/95; 257/96; 257/97; 257/11; 257/12; 257/13; 257/745
(58) Field of Search .............................. 257/94, 95, 96, 257/97, 11, 12, 13, 745, 101, 102

(56) References Cited

U.S. PATENT DOCUMENTS 5,442,201 A * 8/1995 Adomi et al. ................. 257/86
5,912,476 A * 6/1999 Watanabe et al. ............. 257/94

FOREIGN PATENT DOCUMENTS

JP 2000-312032 11/2000

* cited by examiner

Primary Examiner—Eddie Lee
Assistant Examiner—Samuel A Gebremariam
(74) Attorney, Agent, or Firm—Snider & Associates; Ronald R. Snider

(57) ABSTRACT

A GaAsP-base light emitting element capable of sustaining an excellent light emission property for a long period, and a method for manufacturing thereof are provided. The light emitting element 1 has a p-n junction interface responsible for light emission formed between a p-type $GaAs_{1-a}P_a$ layer 9 and an n-type $GaAs_{1-a}P_a$ layer 8, and has a nitrogen-doped zone 8c formed in a portion including the p-n junction interface between such p-type $GaAs_{1-a}P_a$ layer 9 and n-type $GaAs_{1-a}P_a$ layer 8. Such element can be manufactured by fabricating a plurality of light emitting elements by varying nitrogen concentration Y of the nitrogen-doped zone 8c while keeping a mixed crystal ratio a of the p-type $GaAs_{1-a}P_a$ layer 9 and n-type $GaAs_{1-a}P_a$ layer 8 constant; finding an emission luminance/nitrogen concentration relationship by measuring emission luminance of the individual light emitting elements; and adjusting the nitrogen concentration of the nitrogen-doped zone 8c so as to fall within a range from $1.05Y_p$ to $1.5Y_p$, where $Y_p$ is defined as a peak nitrogen concentration whereat the emission luminance of the light emitting element will become maximum at a mixed crystal ratio a.

18 Claims, 9 Drawing Sheets

- N atom
○ emissive site
△ non-emissive site

FIG. 4C auto-absorption

LIGHT EMITTING ELEMENT AND METHOD FOR MANUFACTURING THEREOF

RELATED APPLICATION

This application claims the priority of Japanese Patent Application No. 2001-133247 filed on Apr. 27, 2001, which is incorporated herein by reference.

FIELD OF THE INVENTION

The present invention relates to a light emitting element using compound semiconductor and a method for manufacturing thereof.

DESCRIPTION OF THE BACKGROUND ART

General method for manufacturing light emitting diodes or semiconductor laser elements is such that forming a plurality of compound semiconductor layers on a compound semiconductor singlecrystalline substrate to thereby obtain a multi-layered compound semiconductor wafer having formed therein a p-n junction, and fabricating such wafer into elements. Among these, light emitting diode made from III-V compound semiconductor, and in particular, gallium arsenide phosphide $GaAs_{1-a}P_a$-base (where a relation of $0.45 \leq a \leq 1.0$ is satisfied) light emitting diode can be fabricated by forming a plurality of gallium arsenide phosphide $GaAs_{1-a}P_a$ (or gallium phosphide GaP) epitaxial layers on a gallium phosphide GaP or gallium arsenide GaAs singlecrystalline substrate, and by diffusing a p-type impurity such as Zn in the uppermost layer of such epitaxial layers, where selecting mixed crystal ratio a will result in light emission at wavelength region covering red, orange and yellow regions. The reason why the range of the mixed crystal ratio a is defined as $0.45 \leq a \leq 1.0$ resides in that enhancing indirect transition emission using nitrogen as an isoelectronic trap, which will be described in the next paragraphs.

$GaAs_{1-a}P_a$-base compound semiconductor has a band structure responsible for indirect transition and is not advantageous in obtaining excellent light emission property in the intact state, so that it is a general practice to dope nitrogen (N) to thereby raise the emission efficiency. Nitrogen can raise the emission efficiency since it forms an isoelectronic trap which acts as a luminescent center in the compound semiconductor, to thereby restrict motion of electrons and widen the distribution range of the electron momentum in a wave number vector-momentum space, which successfully increases direct transition components.

Of the entire nitrogen doped in the $GaAs_{1-a}P_a$-base compound semiconductor, only a portion thereof residing in a restricted area in the vicinity of the p-n junction portion, where most of emissive recombination of the carrier occur, is contributable to improve light emission efficiency, whereas excessive nitrogen doped in the other area may adversely lower the emission efficiency since it can act as a photo-absorbing center. Japanese Laid-Open Patent Publication No. 2000-312032 thus proposes a structure of light emitting element in which an area having a nitrogen concentration lower than that in the p-n junction is formed on the p layer side, to thereby suppress the emission loss due to light absorption.

The light emitting element of the foregoing publication however suffers from the problems below.

(1) An extremely wide numerical range of $0.3 \times 10^{18}$ atoms/cm³ to $9 \times 10^{18}$ atoms/cm³ is disclosed as the concentration of nitrogen to be doped to the p-n junction portion, which is far from being a numerical range for optimizing the emission luminance. There is no consideration on effects on the optimum nitrogen concentration depending on the emission wavelength, that is, exerted by the mixed crystal ratio of a compound semiconductor used.

(2) Too much emphasis on the emission luminance described in the above (1) may not always yield best results in view of long-term sustainment of the element performance.

(3) The improved emission output is ascribable to the constitution in which the n-type layer side of the p-n junction portion is a low-carrier-concentration layer, whereas the p-type layer side has a lowered nitrogen concentration so as to suppress the light absorption. However in such constitution, the light emission is essentially ascribable to hole injection to the n-type layer side, so that the lowered nitrogen concentration in the p-type layer side is not so effective in suppressing the light absorption.

It is therefore a first object of the present invention to provide a GaAsP-base light emitting element capable of sustaining an excellent light emission property for a long period, and a method for manufacturing thereof. It is a second object to provide a GaAsP-base light emitting element having a high luminance and further capable of suppressing light absorption more effectively than in the previous constitution.

SUMMARY OF THE INVENTION

To solve the foregoing problems, the light emitting element of the present invention is characterized in that comprising:

a p-n junction portion responsible for light emission formed between a p-type $GaAs_{1-a}P_a$ layer (where a represents mixed crystal ratio and satisfies a relation of $0.45 \leq a \leq 1.0$) and an n-type $GaAs_{1-a}P_a$ layer (where a represents mixed crystal ratio and satisfies a relation of $0.45 \leq a \leq 1.0$); and a first nitrogen-doped zone formed in a portion including the p-n junction interface between such p-type $GaAs_{1-a}P_a$ layer and n-type $GaAs_{1-a}P_a$ layer, wherein nitrogen concentration of such first nitrogen-doped zone is set higher than the nitrogen concentration whereat the emission luminance of the light emitting element reaches maximum.

A method for manufacturing a light emitting element is characterized in that manufacturing a light emitting element which comprises a p-n junction portion responsible for light emission formed between a p-type $GaAs_{1-a}P_a$ layer (where a represents mixed crystal ratio and satisfies a relation of $0.45 \leq a \leq 1.0$) and an n-type $GaAs_{1-a}P_a$ layer (where a represents mixed crystal ratio and satisfies a relation of $0.45 \leq a \leq 1.0$); and a first nitrogen-doped zone formed in a portion including the p-n junction interface between such p-type $GaAs_{1-a}P_a$ layer and n-type $GaAs_{1-a}P_a$ layer, and such method comprises the steps of:

fabricating a plurality of light emitting elements by varying nitrogen concentration Y of the first nitrogen-doped zone while keeping a mixed crystal ratio a of the p-type $GaAs_{1-a}P_a$ layer and n-type $GaAs_{1-a}P_a$ layer constant;

finding an emission luminance/nitrogen concentration relationship by measuring emission luminance of the individual light emitting elements;

finding from such relationship a nitrogen concentration $Y_p$ whereat the emission luminance of the light emitting element will become maximum; and forming the first nitrogen-doped zone so as to have a nitrogen concentration larger than the nitrogen concentration $Y_p$.

It should now be noted that notation "$GaAs_{1-a}P_a$" hereinafter is to express a concept covering both of gallium arsenide phosphide and gallium phosphide unless otherwise being specifically noted.

Figure 3:
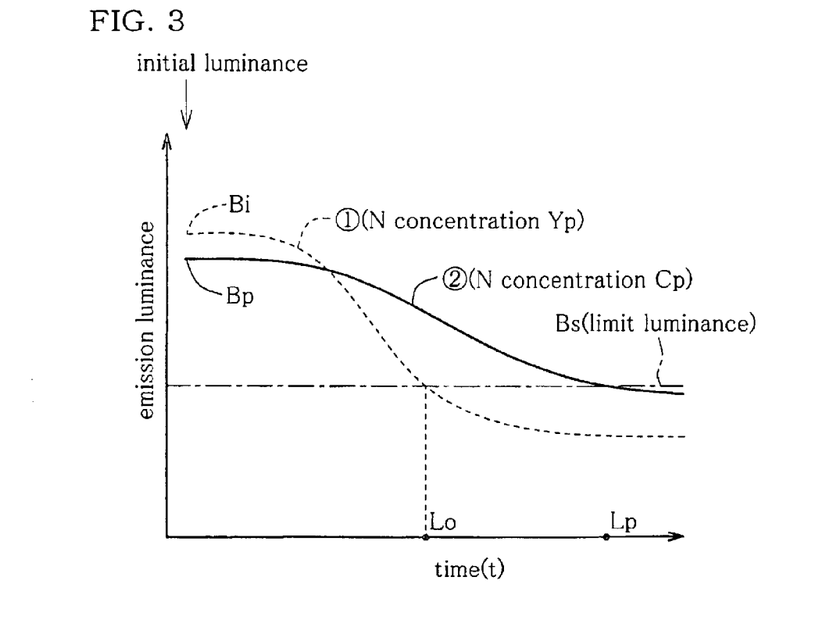
FIG. 3 is a graph schematically showing relations between cumulative current supply time and emission luminance.

The light emitting element having formed therein the p-n junction between the n-type $GaAs_{1-a}P_a$ layer and p-type $GaAs_{1-a}P_a$ layer (referred to as GaAsP-base light emitting element hereinafter, which includes GaP-base light emitting element having mixed crystal ratio a of the n-type $GaAs_{1-a}P_a$ layer and p-type $GaAs_{1-a}P_a$ layer of 1) will be successful in raising the emission efficiency as described in the above by virtue of doped nitrogen which functions as an isoelectronic trap, but the element is also known to cause gradual decrease in the emission luminance with time of current supply as indicated by curve ① in FIG. 3. As is known from FIG. 3, the luminance decreases with the elapse of cumulative current supply time t from an initial luminance $B_1$ measured immediately after start of the constant current supply. Length of time necessary for the luminance to reach a predetermined limit luminance $B_s$, or ratio of the initial luminance and luminance attained after the elapse of predetermined time period typically 1,000 hours (referred to as element life L, hereinafter), can provide an index for assessing the element life.

Figure 2:
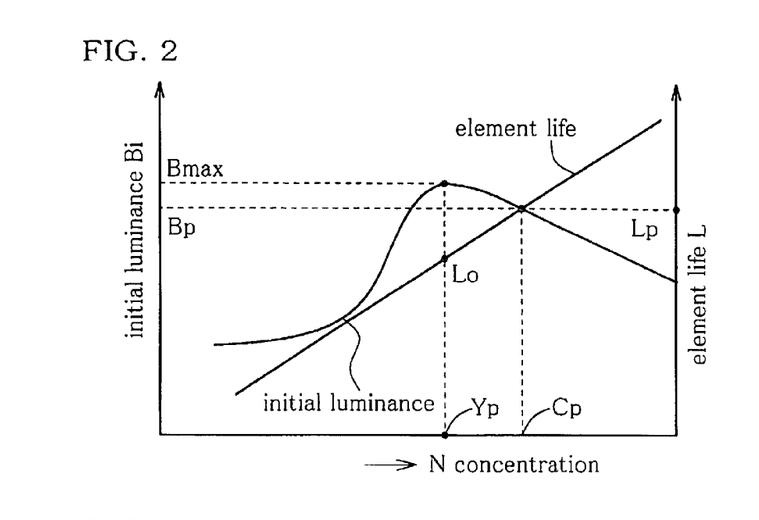
FIG. 2 is a graph schematically showing relations of initial luminance and element life with nitrogen concentration of emissive layer.

Examination by the present inventors revealed the following facts. As shown in FIG. 2, both of the initial luminance $B_1$ and element life L vary depending on the nitrogen concentration. Of these, the initial luminance $B_i$ reaches maximum at a certain peak nitrogen concentration $Y_p$. The peak nitrogen concentration $Y_p$ shifts towards the higher concentration region as the mixed crystal ratio a of $GaAs_{1-a}P_a$ increases, that is, the emission wavelength is shortened.

Higher initial luminance $B_i$ will generally be presumed as advantageous in terms of the element life L since a correspondently larger luminance margin will be expected in preparation for the deterioration. That is, it will be a natural way for those skilled in the art to suppose that employing the peak nitrogen concentration $Y_p$ whereat the initial luminance $B_i$ reaches maximum undoubtedly optimizes the element life L. Thorough investigations by the present inventors however revealed that such understanding cannot apply to the GaAsP-base light emitting element. As indicated by curve ① in FIG. 3, the peak nitrogen concentration $Y_p$ does not always ensures desirable element life L although sufficient emission luminance can be obtained in the initial stage of the current supply. Instead, employing a concentration $C_p$ which resides in a slightly higher concentration range shifted from the peak nitrogen concentration $Y_p$ will eminently suppress the time-dependent deterioration in the emission luminance due to prolonged current supply, although the initial luminance $B_i$ becomes Bp which is slightly lower than a value $B_{max}$ obtainable at the peak nitrogen concentration $Y_p$ as indicated by curve ② in FIG. 3. This successfully results in improvement in the life from $L_o$ to $L_p$ while keeping the initial luminance at a sufficiently high level.

From the investigation results of the present inventors, the nitrogen concentration dependency of the initial luminance $B_i$ and element life L were found to show almost same tendencies irrespective of the mixed crystal ratio a as described in the next. When viewing FIG. 2 along the increasing direction of nitrogen concentration, the initial luminance $B_i$ eminently increases immediately before the peak nitrogen concentration $Y_p$ is reached, but moderately decreases thereafter with increase in the nitrogen concentration. On the other hand, the element life L monotonously increases with increase in the nitrogen concentration. So that employing the nitrogen concentration $C_p$ which resides in a range causative of gradual decrease in the initial luminance $B_i$ will successfully extend the element life L without causing a significant decrease in the initial luminance $B_i$. The nitrogen concentration of the first nitrogen-doped zone is preferably adjusted to $1.05Y_p$ or larger and $1.5Y_p$ or less, where $Y_p$ is defined as a peak nitrogen concentration whereat the emission luminance reaches maximum. The nitrogen concentration less than $1.05Y_p$ may result in only an insufficient effect of improving the element life, and exceeding $1.5Y_p$ may result in an extreme shortage of the initial luminance $B_i$, which may make the element unpractical.

Figure 4A:
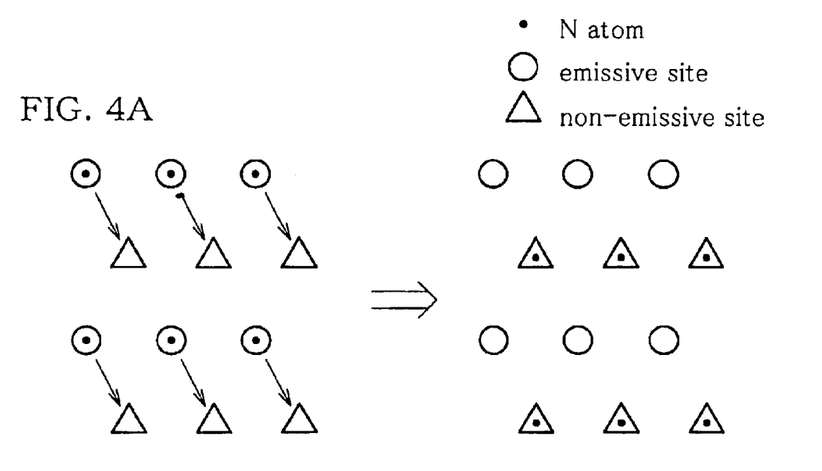
FIGS. 4A to 4C are schematic drawings of possible degradation mechanism of emission luminance.

The relation between the initial luminance or element life with nitrogen concentration can be understood assuming a mechanism described in the next. In general, nitrogen atoms capable of acting as luminescent centers in the GaAsP-base light emitting element are only those occupying specific sites (lattice points) in the semiconductor crystal, so that once such sites (referred to as emissive sites, hereinafter) are saturated as shown in FIG. 4C, excessive nitrogen atoms then occupy sites which cannot be responsible for the light emission (referred to as non-emissive sites, hereinafter), which is causative of absorption of the light generated at the emissive sites, to thereby lower the emission efficiency. Thus the emission luminance first increases with increase in the nitrogen concentration until the emissive sites are occupied to a certain extent, and then decreases due to increased light absorption by the nitrogen atoms occupying the non-emissive sites (or a part of emission sites) (which may occasionally be referred to as "nitrogen-induced auto-absorption", hereinafter). This is a rough explanation for the reason why the nitrogen concentration dependency of the initial luminance $B_i$ has a maximum value (peak nitrogen concentration $Y_p$).

On the other hand, various recent reports suggest a deterioration mechanism by which nitrogen atoms initially occupying the emissive sites gradually migrate to the non-emissive sites in a long duration of current supply to the element (referred to as "inter-site nitrogen migration", hereinafter). Once such situation occurs, the concentration of nitrogen atoms occupying the emissive sites (referred to as "effective nitrogen concentration", hereinafter) gradually decreases despite the apparent nitrogen concentration remains unchanged, which results in the time-dependent degradation of the emission luminance as previously shown in FIG. 3. In this case, as shown in FIG. 4A, the emissive sites are occupied by nitrogen atoms in an approximately exact manner while leaving the non-emissive sites just as true vacant at the peak nitrogen concentration $Y_p$, which provides a condition likely to induce the inter-site nitrogen migration causative of the deterioration. It is thus supposed that, even though the initial luminance $B_i$ is satisfactory, the effective nitrogen concentration will sharply decrease due to promotional trends in the inter-site nitrogen migration, to thereby ruin the element life.

Figure 4B:
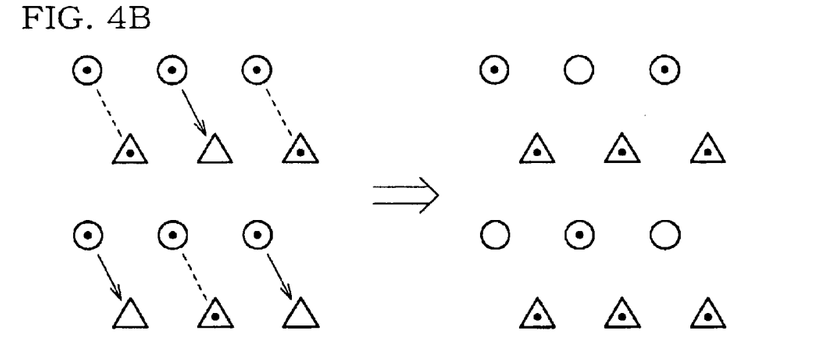
Figure 4C:
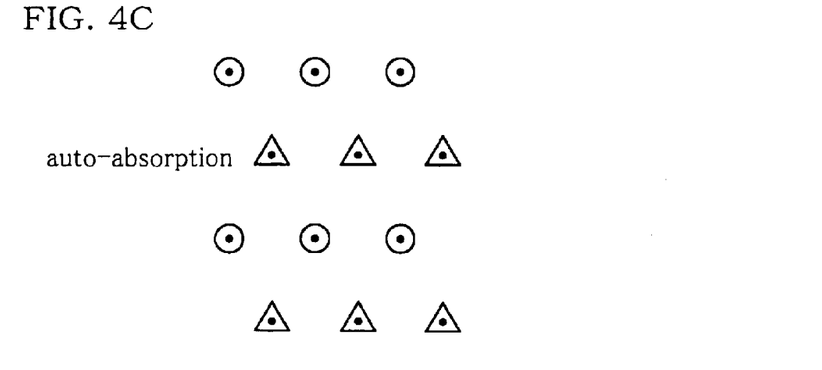

On the contrary, if nitrogen atoms are contained in an amount properly excessive over the peak nitrogen concentration $Y_p$, a part of the non-emissive sites are occupied by the nitrogen atoms already in the initial stage as shown in FIG. 4B, which effectively blocks the nitrogen migration from the emissive sites. The inter-site nitrogen migration is supposed to proceed via the vacant sites (vacant lattice points) similarly to that in general diffusion mechanism. So that the occupied non-emissive sites located in a properly distributed manner will obstruct migration path of the nitrogen atoms, to thereby effectively suppress the inter-site nitrogen migration and improve the element life.

In the present invention, it is allowable to set the carrier concentration of the n-type $GaAs_{1-a}P_a$ layer lower than that of the p-type $GaAs_{1-a}P_a$ layer, and to form a low-nitrogen-concentration zone, having a nitrogen concentration lower than that of the first nitrogen-doped zone, formed so as to be adjacent to such first nitrogen-doped zone. The light emitting element of the present invention preferably has a p-n junction portion responsible for light emission formed between a p-type $GaAs_{1-a}P_a$ layer (where a represents mixed crystal ratio and satisfies a relation of $0.45 \leq a \leq 1.0$) and an n-type $GaAs_{1-a}P_a$ layer (where a represents mixed crystal ratio and satisfies a relation of $0.45 \leq a \leq 1.0$); and has a first nitrogen-doped zone formed in the p-type $GaAs_{1-a}P_a$ layer and/or n-type $GaAs_{1-a}P_a$ layer so as to include the p-n junction interface, wherein the n-type $GaAs_{1-a}P_a$ layer has a carrier concentration lower than that of the p-type of $GaAs_{1-a}P_a$ layer, and further preferably has a low-nitrogen-concentration zone, having a nitrogen concentration lower than that of the first nitrogen-doped zone, formed so as to be adjacent to such first nitrogen-doped zone.

In the GaAsP-based light emitting element using the p-n junction, it is preferable in view of improving the emission efficiency to set the carrier concentration of the n-type $GaAs_{1-a}P_a$ layer lower than that of the p-type $GaAs_{1-a}P_a$ layer, where both layers compose the p-n junction. More specifically, the majority carrier concentration of the n-type layer is decreased to as low as $0.1 \times 10^{15}/cm^3$ to $3.0 \times 10^{15}/cm^3$, and the majority carrier concentration of the p-type layer is raised to as high as $1.0 \times 10^{18}/cm^3$ to $5.0 \times 10^{18}/cm^3$, to thereby attain a structure in which hole injection into the n-type layer based on the carrier concentration gradient at the junction is prevailing. In the case of employing such structure, nitrogen-induced auto-absorption loss of light can effectively be suppressed and the emission efficiency of the element can be improved, if the first nitrogen-doped zone having a relatively high nitrogen concentration is formed in the n-type layer specifically within a range distant by a predetermined length away from the p-n junction, and using the residual portion of the n-type layer adjacent thereto as a low-nitrogen-concentration zone.

In the above constitution, also the p-type $GaAs_{1-a}P_a$ layer can have formed therein the low-nitrogen-concentration zone, having a nitrogen concentration lower than that of the first nitrogen-doped zone, so as to be adjacent to such first nitrogen-doped zone. The low-nitrogen-concentration zone formed in the p-type layer similarly show an effect of improving the emission efficiency of the element although not so eminent as the effect shown by that on the n-type layer side.

While an optimum range of the nitrogen concentration of the first nitrogen-doped zone may vary depending on the mixed crystal ratio a of the n-type $GaAs_{1-a}P_a$ layer and the p-type $GaAs_{1-a}P_a$ layer as described in the above, it will never be set outside a range from $1.33 \times 10^{18}$ atoms/cm$^3$ to $5.56 \times 10^{18}$ atoms/cm$^3$. The nitrogen concentration of less than $1.33 \times 10^{18}$ atoms/cm$^3$ may result in considerably lowered emission intensity due to shortage of the isoelectronic trap sites, and the concentration exceeding $5.56 \times 10^{18}$ atoms/cm$^3$ may again result in lowered emission intensity due to increased auto-absorption loss of light induced by nitrogen.

On the other hand, the low-nitrogen-concentration zone is preferably provided as a second nitrogen-doped zone having a nitrogen concentration within a range from $1.06 \times 10^{18}$ atoms/cm$^3$ to $5.28 \times 10^{18}$ atoms/cm$^3$. Since there is still some probability of causing emissive recombination also in the low-nitrogen-concentration zone distant from the p-n junction, so that doping of nitrogen also in such zone in an amount of $1.06 \times 10^{18}$ atoms/cm$^3$ or above can further raise the emission efficiency. Doping of nitrogen exceeding $5.28 \times 10^{18}$ atoms/cm$^3$ will however result in lowered emission intensity due to increased auto-absorption loss of light induced by nitrogen.

DETAILED DESCRIPTION OF THE PREFERRED EMBODIMENT

Preferred embodiments for carrying out the present invention will be explained referring to several examples shown in the attached drawings.

FIG. 1 shows an exemplary light emitting element of the present invention having a light emitting layer portion formed with a GaAsP-base III-V compound semiconductor. The light emitting element 1 is formed on a GaP (or GaAs) singlecrystalline substrate 4, a GaP buffer layer (GaAs layer for the GaAs substrate) 5, an n-type $GaAs_{1-x}P_x$ mixed-crystal-ratio gradient layer 6 having a mixed crystal ratio x varying in the thickness-wise direction, a $GaAs_{1-a}P_a$ mixed-crystal-ratio constant layer 7 having a constant mixed crystal ratio x (x=a), an n-type $GaAs_{1-a}P_a$ layer 8, and a p-type $GaAs_{1-a}P_a$ layer 9 so as to be stacked in this order, and electrodes 13, 14 for current supply are attached on both major surfaces of such stack. The p-type $GaAs_{1-a}P_a$ layer 9 is doped with Zn as a p-type dopant in an amount of $1.0 \times 10^{18}/cm^3$ to $5.0 \times 10^{18}/cm^3$ or around. It should now be noted in the case the mixed crystal ratio x is 1 (i.e., when GaP is used), GaP singlecrystalline substrate 4 is used but there is no need to use the mixed-crystal-ratio gradient layer 6.

The n-type $GaAs_{1-a}P_a$ layer 8 is doped with nitrogen (N) which functions as an isoelectronic trap for raising the emission luminance. More specifically, it comprises a nitrogen concentration increasing zone $8a$ formed on the mixed-crystal-ratio constant layer 7 as being adjacent thereto in which the concentration of doped nitrogen gradually increases, a second nitrogen-doped zone (low-nitrogen-concentration zone) $8b$ having a nitrogen concentration within a range from $1.06 \times 10^{18}$ atoms/cm$^3$ to $5.28 \times 10^{18}$ atoms/cm$^3$, and a first nitrogen-doped zone $8c$ having a nitrogen concentration set so as to exceed that of the second nitrogen-doped zone $8b$. The nitrogen concentration of the first nitrogen-doped zone $8c$ is adjusted to a certain concentration $C_p$ residing within a range from $1.5Y_p$ to $1.5Y_p$ as shown in FIG. 2 in order to attain the effect of the present invention described in the above based on the peak nitrogen concentration $Y_p$ which is determined depending on the mixed crystal ratio a (see FIGS. 8, 9 and 10 for specific examples). The p-type GaAs$_{1-a}$P$_a$ layer 9 is doped with nitrogen at a concentration equivalent to that in the second nitrogen-doped zone $8b$.

Figures 1A, 1B:
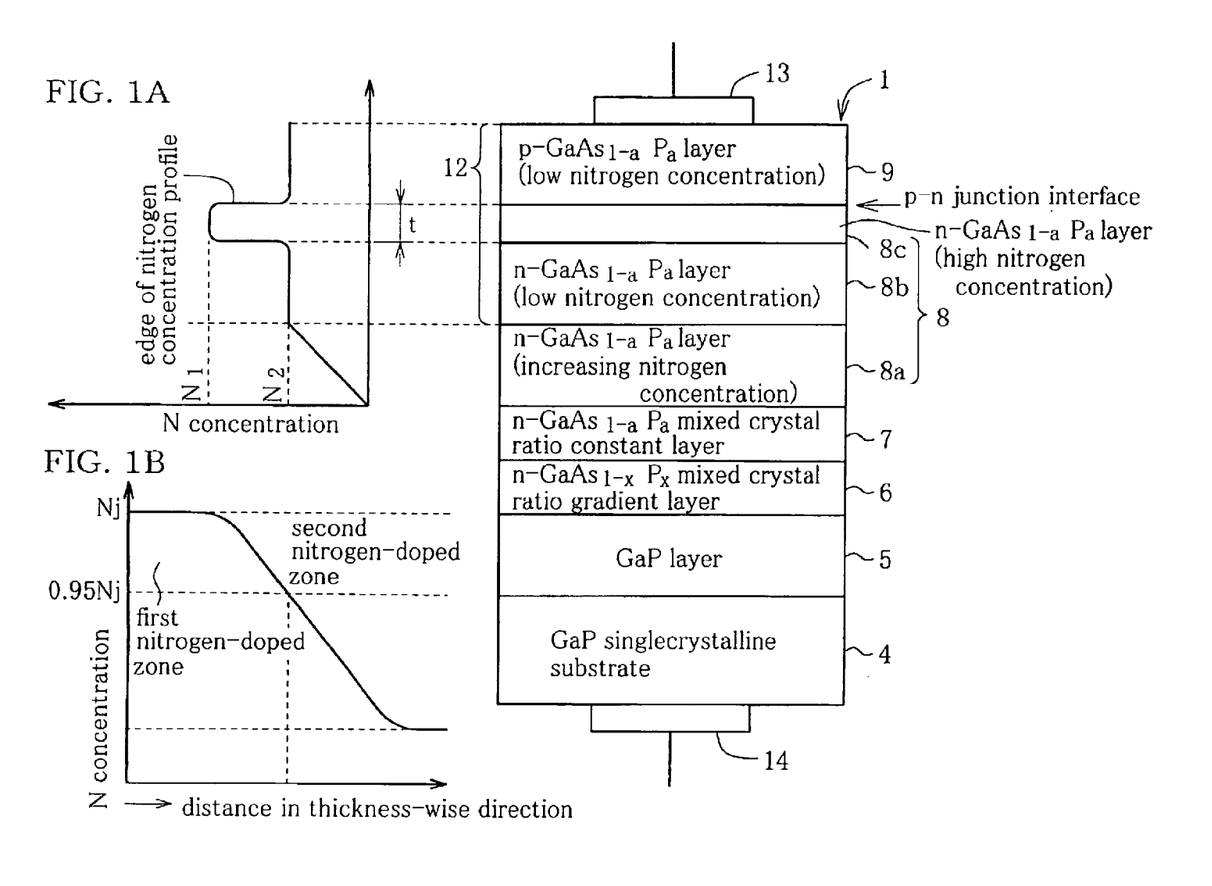
FIGS. 1A and 1B are schematic drawings of an exemplary GaAsP-base light emitting element of the present invention.

The nitrogen concentration of the individual layers can be measured by known procedures of SIMS (secondary ion mass spectroscopy). The nitrogen concentration can be quantified with a resolution as fine as $2 \times 10^{16}$ atoms/cm$^3$ or around using Cs as a primary ion species and SiN$^-$ as a secondary ion. If a polished section of any layer is scanned with an ion beam as a probe in the thickness-wise direction, a depth profile of the nitrogen concentration can be measured. When the measurement result showed that the first nitrogen-doped zone $8c$ and the second nitrogen-doped zone $8b$ respectively have a constant concentration zone in which the nitrogen concentration is kept at almost constant as shown in FIG. 1B, a boundary between both zones is defined at a position attaining $0.95N_3$, where $N_3$ is a nitrogen concentration in such constant concentration zone of the first nitrogen-doped zone $8c$. The nitrogen concentration in the constant concentration zone of the second nitrogen-doped zone $8b$ is preferably within a range from $0.80N_3$ to $0.95N_3$.

The light emitting element 1 having such constitution causes light emission mainly attributable to hole injection into the n-type layer 8 based on carrier concentration gradient at the p-n junction portion. The light can be taken out from the side of the electrode 13 in a form of summation of a direct light advances towards the p-type layer 9 and a reflected light reflected on the substrate 4 after being leaked into the n-type layer 8. So that the reflected light should make two round trips through the n-type layer 8 before being taken out from the side of the electrode 13. In this light emitting element 1, the nitrogen concentration is selectively raised in the zone $8c$ in the vicinity of the p-n junction interface, and is set low in the residual zones $8a$, $8b$, so that the nitrogen-induced, auto-absorption loss of the reflected light reciprocating through the n-type layer 8 is effectively reduced, which beneficially attains a high emission efficiency.

The foregoing light emitting element 1 can be manufactured as follows. Referring to FIG. 1, on a GaP (or GaAs) singlecrystalline substrate 4, the GaP buffer layer (GaAs layer for the GaAs substrate) 5 is formed by epitaxial growth, further thereon the n-type GaAs$_{1-x}$P$_x$ mixed-crystal-ratio gradient layer 6 having a mixed crystal ratio x varying in the thickness-wise direction is formed by epitaxial growth, and further thereon the GaAs$_{1-a}$P$_a$ mixed-crystal-ratio constant layer 7 having a constant mixed crystal ratio x (x=a) is formed. On such mixed-crystal-ratio constant layer 7, the n-type GaAs$_{1-a}$P$_a$ layer 8 doped with nitrogen (N) which functions as an isoelectronic trap for raising the emission luminance is formed by epitaxial growth, to thereby obtain an epitaxial wafer. During the growth of the n-type GaAs$_{1-a}$P$_a$ layer 8, nitrogen is doped together with an n-type dopant. On thus obtained epitaxial wafer, the p-type GaAs$_{1-a}$P$_a$ layer 9 is formed by diffusing Zn as a p-type impurity from the outermost surface of the n-type GaAs$_{1-a}$P$_a$ layer 8 (that is, the p-type GaAs$_{1-a}$P$_a$ layer 9 is formed by diffusing Zn from the major surface opposite to the p-n junction interface). The electrodes 13, 14 are then attached, the wafer is diced into chips of an appropriate size, and the diced chips are encapsulated in packages to thereby complete light emitting diodes as the light emitting elements.

Figure 5:
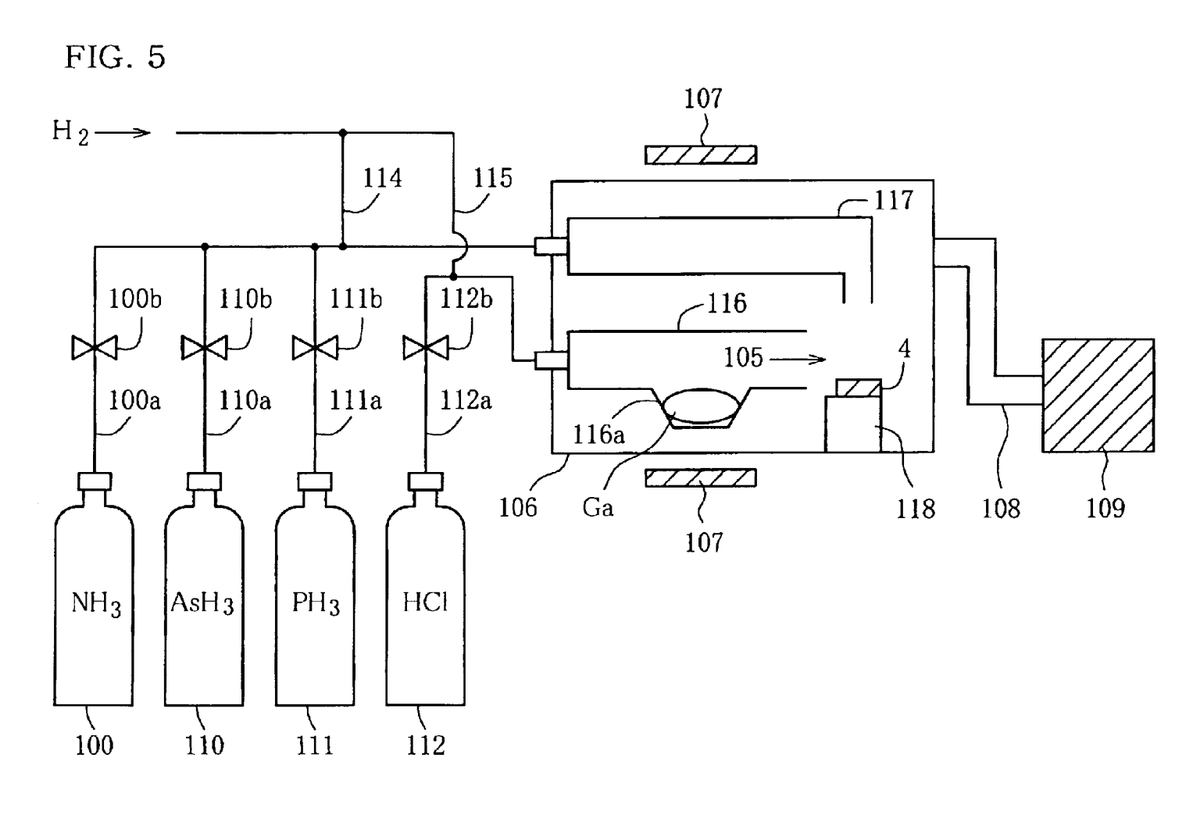
FIG. 5 is a schematic drawing of an exemplary apparatus for manufacturing the GaAsP-base light emitting element of the present invention.

FIG. 5 schematically shows an apparatus for manufacturing the foregoing epitaxial wafer by the hydride vapor phase epitaxy (HVPE) process. The apparatus has a reaction vessel 106, in which an open-ended, quartz-made chloride reaction tube 116, a substrate susceptor 118 adjacent to the opening of such chloride reaction tube 116, and a quartz-made, group V gas introducing pipe 117 for blowing a group V source gas onto the major surface of the singlecrystalline substrate 4 placed on the substrate susceptor 118, where the gas is typified by a mixed gas of arsine (AsH$_3$) and phosphine (PH$_3$) whose mixing ratio is adjusted so as to attain a desired mixed crystal ratio. The chloride reaction tube 116 has at the inner bottom thereof a recess $116a$ in which solid gallium (Ga) is housed.

The chloride reaction tube 116 is connected with an HCl supply pipe $112a$ for supplying hydrogen chloride (HCl) to such chloride reaction tube 116, and the group V gas introducing pipe 117 is connected with supply pipes $110a$, $111a$ for supplying AsH$_3$ and PH$_3$, respectively, to such group V gas introducing pipe 117. Mixing ratio of AsH$_3$ and PH$_3$ is adjusted using valves $110b$, $111b$. All of AsH$_3$, PH$_3$ and HCl are diluted to an appropriate concentration with hydrogen (H$_2$) as a carrier gas which is supplied through hydrogen pipes 114, 115 communicating with the individual supply pipes $110a$, $111a$ and $112a$, and are then supplied into the reaction vessel 106.

Ammonia (NH$_3$) which serves as a source of nitrogen to be doped is supplied to the group V introducing pipe 117 together with AsH$_3$ and PH$_3$, where the amount of supply is regulated by a valve $100b$. The gallium crystal placed in the reaction vessel 106 is heated by a heater 107 to an proper temperature, for example to 750° C. Reference numerals 108 denotes an exhaust pipe, and 109 denotes an exhaust gas treatment unit. The individual gases of NH$_3$, AsH$_3$, PH$_3$ and HCl are supplied from cylinders 100, 110, 111 and 112 through the pipes $100a$, $110a$, $111a$ and $112a$, respectively.

While keeping the Ga under heating, HCl gas is supplied to the chloride reaction tube 116 to thereby produce GaCl, which is then supplied to the portion where the substrate 4 is placed together with H$_2$ as the carrier gas. There GaCl reacts with AsH$_3$ and PH$_3$ supplied through the group V gas introducing pipe 117 to thereby produce GaAsP mixed crystal, which will be deposited on the substrate 4.

More specifically, the GaP layer 5 in FIG. 1 can epitaxially be grown by releasing the valve $111b$ to supply PH$_3$ while keeping the valve $110b$ closed, so as to allow PH$_3$ to react with GaCl. For epitaxial growth of the n-type GaAs$_{1-x}$P$_x$ mixed-crystal-ratio gradient layer 6, ratio of flow rates (mixing ratio) of AsH$_3$ and PH$_3$ is gradually varied by adjusting the valves $110b$ and $111b$. On the other hand, for the growth of the layers 7, 8 and 9, respectively having a constant mixed crystal ratio, ratio of flow rates of AsH$_3$ and PH$_3$ is kept at constant. NH$_3$ is introduced only during the formation of the layers 8 and 9 to which nitrogen is to be doped. In such case, supply flow rate of NH$_3$ is gradually increased by adjusting the valve 100b during the formation of the layer 8a in which the nitrogen concentration is increased, and supply flow rate of $NH_3$ is kept constant during the formation of the layers 8b, 8c and 9 in which the nitrogen concentration is kept constant. For the formation of a precursory zone for the p-type $GaAs_{1-a}P_a$ layer 9 shown in FIG. 1, supply flow rate of $NH_3$ is set as same with that for the formation of the layer 8b by narrowing the valve 100b.

The p-type $GaAs_{1-a}P_a$ layer 9 shown in FIG. 1 is formed using a diffusion furnace, not shown, provided separatively from the vapor phase growth apparatus shown in FIG. 5, in which Zn is thermally diffused from the outermost surface of the nitrogen concentration constant layer 8b as shown in FIG. 1A so as to form such p-type $GaAs_{1-a}P_a$ layer 9. The p-type $GaAs_{1-a}P_a$ layer 9 is formed corresponding to a Zn-diffused zone as shown in FIG. 6B, and the bottom plane thereof in the depth-wise direction of such Zn-diffused zone forms the p-n junction interface.

Note that it is not always necessary to provide the first nitrogen-doped zone 8c having a higher nitrogen concentration on the side of the p-type $GaAs_{1-a}P_a$ layer 9, since the zone is formed in order to raise the emission efficiency ascribable to hole injection to the n-type $GaAs_{1-a}P_a$ layer 8. In this case, the Zn diffusion should be ended precisely at an edge position of the nitrogen concentration profile of the first nitrogen-doped zone 8c so as to attain an ideal structure. More specifically, the p-n junction interface should coincide with the edge position of the nitrogen concentration profile of the first nitrogen-doped zone as shown in FIG. 6B.

Such precise positional control of the formation of the p-n junction interface is however often difficult due to variation in the performance of manufacturing apparatus or other manufacturing conditions. As typically shown in FIG. 6C, if the Zn diffusion ends before the p-n junction interface reaches the edge of the nitrogen concentration profile, the n-type layer 8 will have a zone having a low nitrogen concentration in the vicinity of the p-n junction interface, which raises an apprehension of considerable lowering in the emission luminance. It will thus be advantageous, as shown in FIG. 6D, to form the Zn diffused zone so that the p-n junction interface invades the first nitrogen-doped zone by a predetermined length, or in other words, so as to overlap with the first nitrogen-doped zone by a predetermined length, whereby the positional dispersion to some degree of the p-n junction interface can be absorbed, and unconformity shown in FIG. 6C will successfully be avoidable.

Figure 6A:
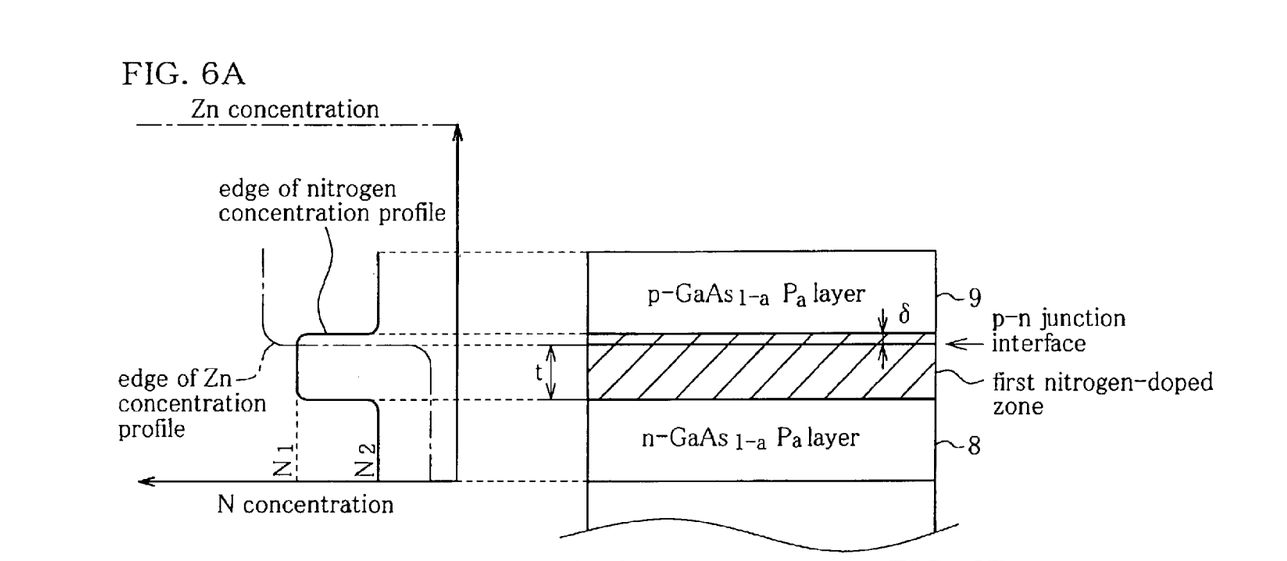
FIGS. 6A to 6D are schematic drawings of various styles of formation of the first nitrogen-doped zone.
Figures 6B, 6C:
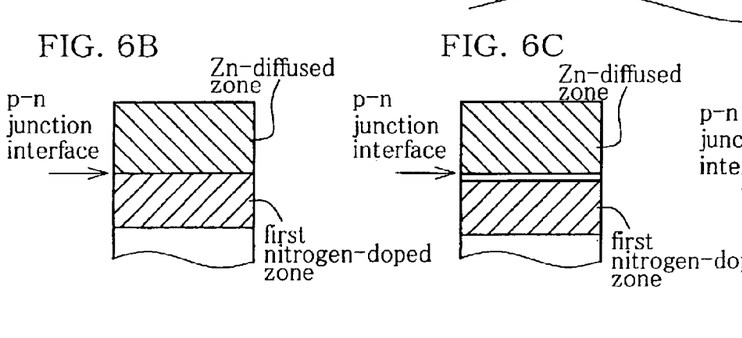
Figure 6D:
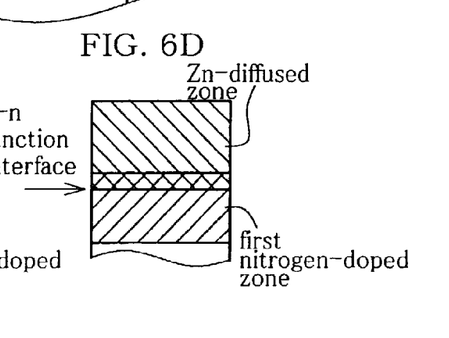

In this case, the first nitrogen-doped zone is formed so as to extend over the p-type $GaAs_{1-a}P_a$ layer 9 and the n-type of $GaAs_{1-a}P_a$ layer 8 as shown in FIG. 6A. A portion of the first nitrogen-doped zone residing in the p-type $GaAs_{1-a}P_a$ layer 9 preferably has a thickness $\delta$ of 1 $\mu$m to 20 $\mu$m. The thickness $\delta$ of less than 1 $\mu$m will result in only an insufficient effect of absorbing the positional dispersion of the p-n junction interface, and exceeding 20 $\mu$m will result in increased nitrogen-induced, auto-absorption loss of light in the p-type layer 9, both of which are causative of lowered luminous efficiency.

In any constitutions shown in FIGS. 1A, 1B and FIGS. 6A to 6D, a portion of the first nitrogen-doped zone (expressed by reference numeral 8c in FIG. 1A, and by hatching in FIGS. 6A to 6D) residing in the n-type $GaAs_{1-a}P_a$ layer 8 preferably has a thickness t of 1 $\mu$m to 50 $\mu$m. The thickness t of less than 1 $\mu$m will result in lowered luminous efficiency since the diffusion length of the minority carrier (hole) in that portion becomes longer than such thickness t, to thereby decrease probability of the emissive recombination. On the other hand, the thickness exceeding 50 $\mu$m will result in increased nitrogen-induced, auto-absorption loss of light, which is also causative of lowered luminous efficiency.

Figure 7:
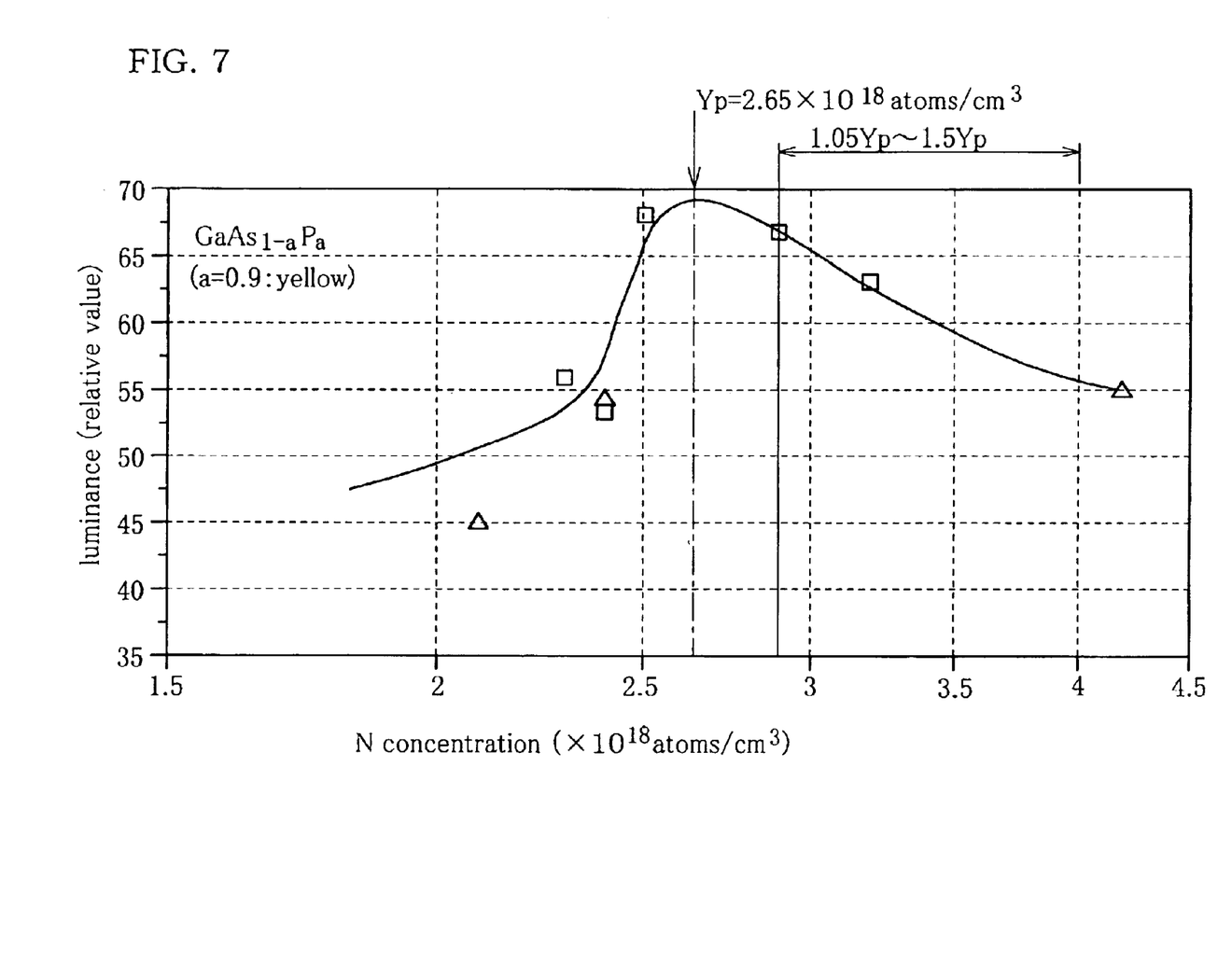
FIG. 7 is a graph showing measured results of emission luminance/nitrogen concentration relationship assuming mixed crystal ratio a=0.9.

FIG. 7 shows a graph obtained by plotting measured results (relative values) of emission luminance relative to the nitrogen concentration (an emission luminance/nitrogen concentration relationship) when the mixed crystal ratio a of the p-type $GaAs_{1-a}P_a$ layer 9 and n-type $GaAs_{1-a}P_a$ layer 8 is fixed at 0.9 (emission wavelength=588 nm, yellow light) for a constitution of the light emitting element 1 shown in FIG. 1, having the p-type layer 9 of 6 $\mu$m thick, and the n-type layer 8 of 20 $\mu$m thick (comprising the first nitrogen-doped zone 8c: 5 $\mu$m; second nitrogen-doped zone 8b: 10 $\mu$m; and nitrogen concentration increasing zone 8a: 5 $\mu$m). The peak concentration $Y_p$ was found to be $2.65 \times 10^{18}$ atoms/cm$^3$, and a decreasing ratio of the emission luminance, assuming the emission luminance at $Y_p$ as 100, within a range from $1.05Y_p$ to $1.5Y_p$ ($2.78 \times 10^{18}$ atoms/cm$^3$ to $4.00 \times 10^{18}$ atoms/cm$^3$) was found to be suppressed to as small to 5 to 20%. The decreasing ratio was found to be further reduced to 5 to 15% within a range from $1.05Y_p$ to $1.3Y_p$ ($2.78 \times 10^{18}$ atoms/cm$^3$ to $3.44 \times 10^{18}$ atoms/cm$^3$).

Figure 8:
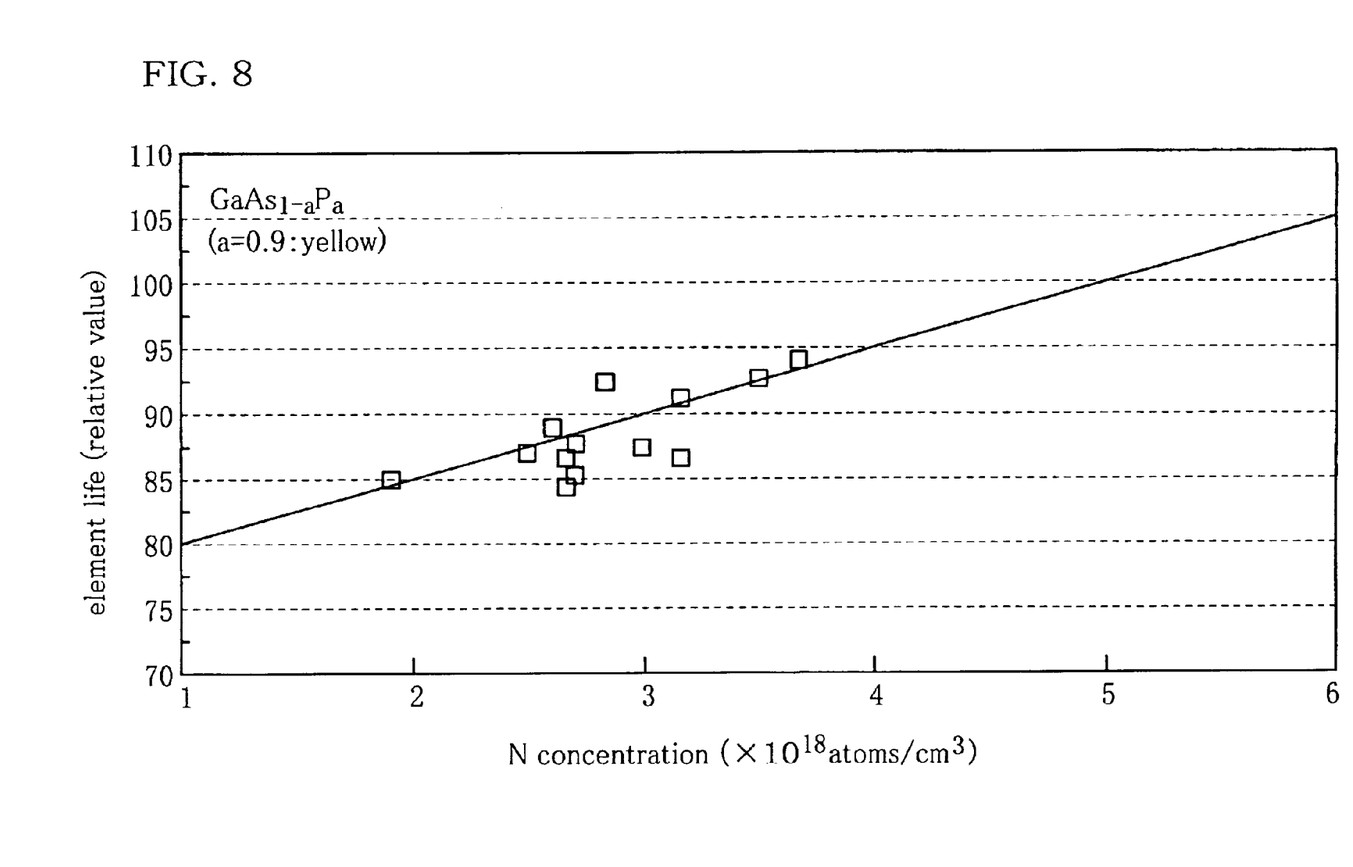
FIG. 8 is a graph showing measured results of element life/nitrogen concentration relationship assuming mixed crystal ratio a=0.9.

FIG. 8 shows a graph obtained by plotting measured results (relative values) of the element life L relative to the nitrogen concentration, where the element life is defined as a ratio between the initial emission luminance and luminance after current supply of 1,000 successive hours at a constant supply current density of 48 A/cm$^2$. The graph revealed that, assuming the element life at $Y_p$ as 100, the element life within a range from $1.05Y_p$ to $1.5Y_p$ increased by 5 to 15%.

Figure 9:
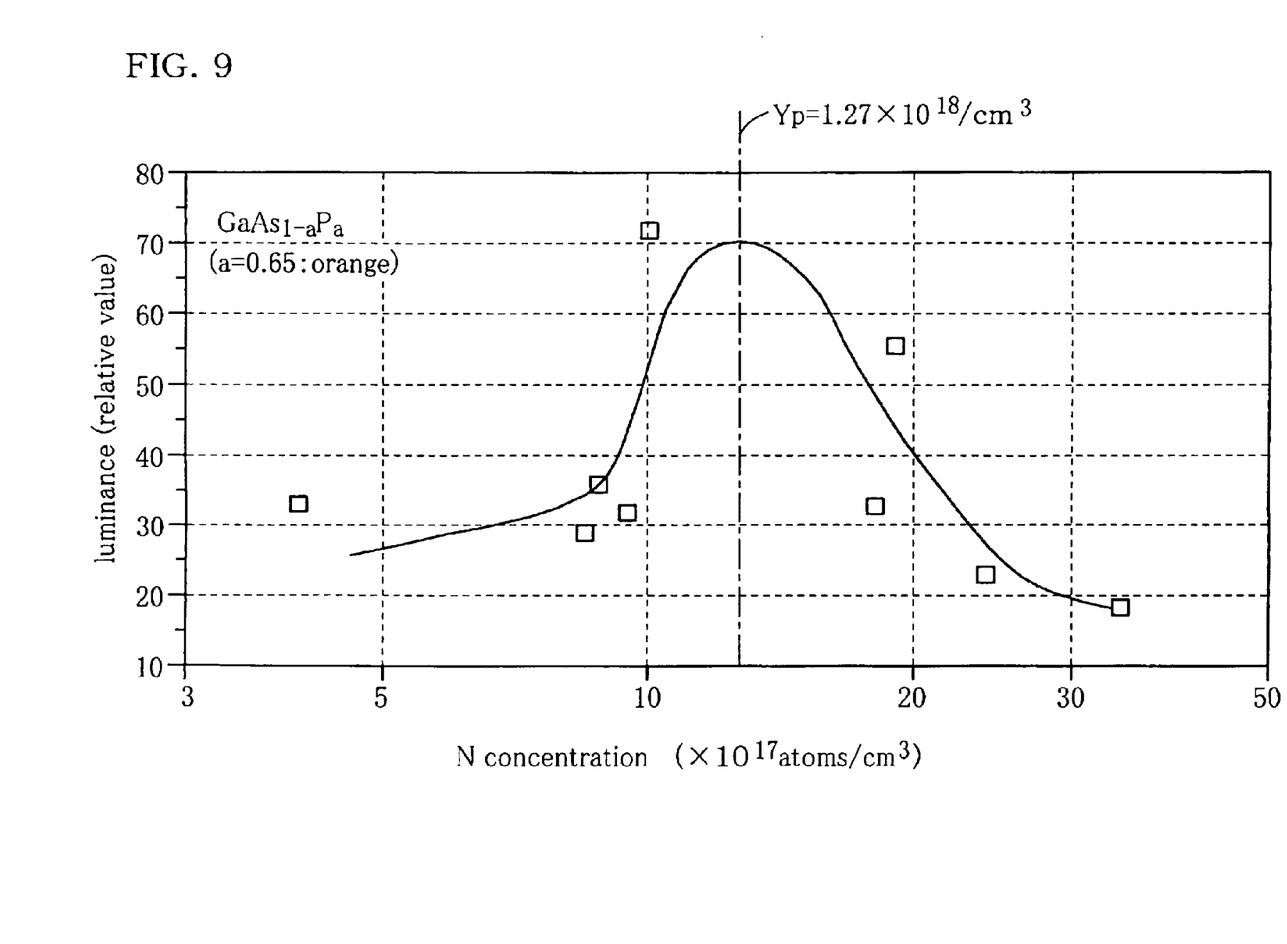
FIG. 9 is a graph showing measured results of emission luminance/nitrogen concentration relationship assuming mixed crystal ratio a=0.65.
Figure 10:
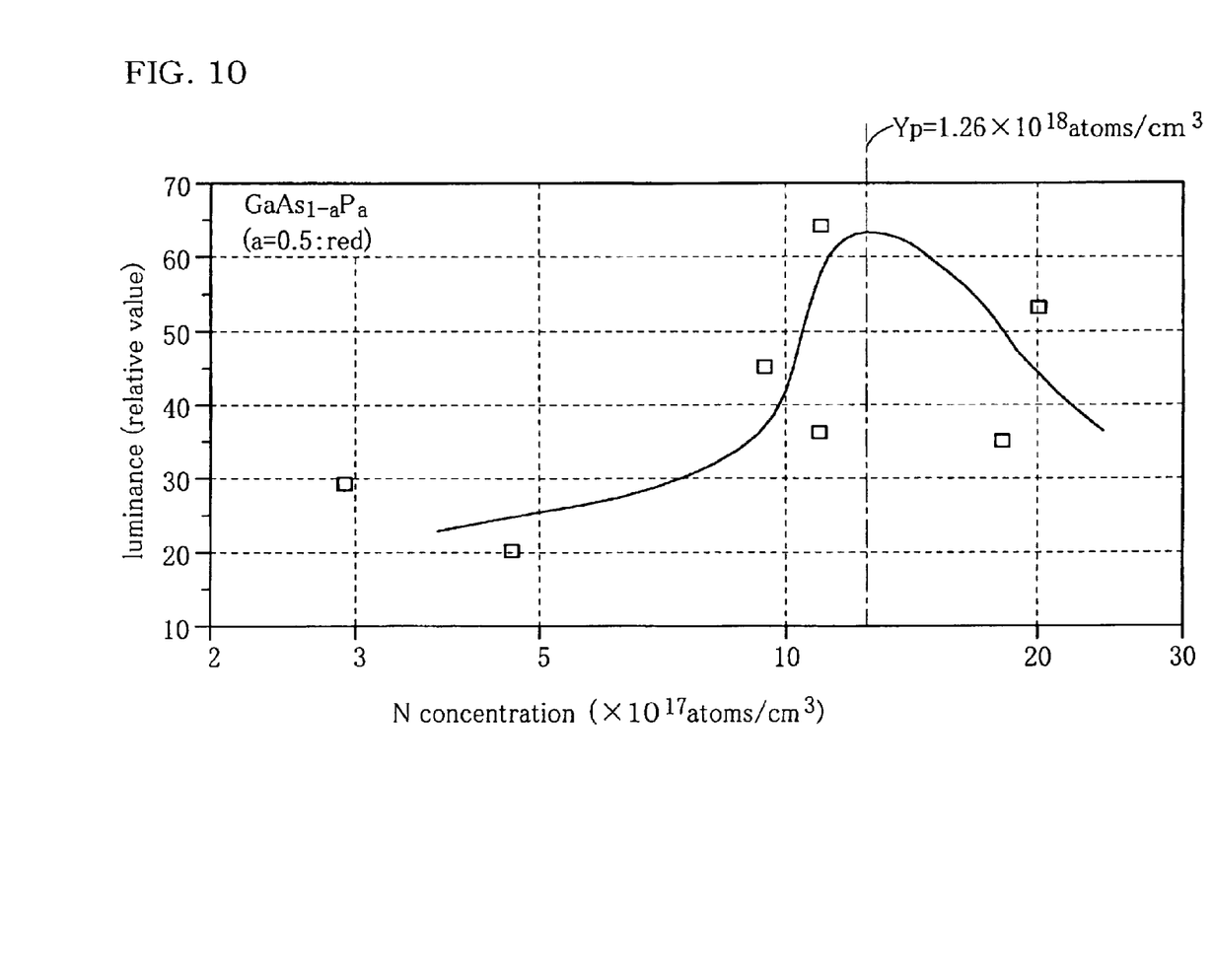
FIG. 10 is a graph showing measured results of emission luminance/nitrogen concentration relationship assuming mixed crystal ratio a=0.5.

FIGS. 9 and 10 show relationships between the emission luminance and nitrogen concentration measured similarly to that shown in FIG. 7 except that the mixed crystal ratios a were fixed to 0.65 (emission wavelength=615 nm, orange light) and 0.5 (emission wavelength=630 nm, red light), respectively. The peak nitrogen concentration $Y_p$ in FIG. 9 was found to be $1.27 \times 10^{18}$ atoms/cm$^3$, and $1.26 \times 10^{18}$ atoms/cm$^3$ in FIG. 10. Curve fitting applied to the a pair of values of the individual $Y_p$ and a found in FIGS. 7, 9 and 10 gave a function of second order shown below:

$$Y_p = 1.3633 \times 10^{19} a^2 - 1.5612 \times 10^{19} a + 5.6575 \times 10^{18} \tag{1}$$

So that in the case of mixed crystal ratio a other than the values obtained in FIGS. 7, 9 and 10, $Y_p$ can be estimated from such equation (1).

What is claimed is:

1. A light emitting element comprising:
   a p-n junction portion responsible for light emission formed between a p-type $GaAs_{1-a}P_a$ layer (where a represents mixed crystal ratio and satisfies a relation of $0.45 \leq a \leq 1.0$) and an n-type $GaAs_{1-a}P_a$ layer (where a represents mixed crystal ratio and satisfies a relation of $0.45 \leq a \leq 1.0$); and
   a first nitrogen-doped zone formed in a portion including the p-n junction interface between such p-type $GaAs_{1-a}P_a$ layer and n-type $GaAs_{1-a}P_a$ layer,
   wherein nitrogen concentration of such first nitrogen-doped zone is set higher than the nitrogen concentration whereat the emission luminance of the light emitting element reaches maximum.

2. The light emitting element according to claim 1, wherein the nitrogen concentration of the first nitrogen-doped zone is adjusted to $1.05Y_p$ or larger and $1.5Y_p$ or less, where $Y_p$, is defined as a peak nitrogen concentration whereat the emission luminance reaches maximum.

3. The light emitting element according to claim 1, wherein the n-type $GaAs_{1-a}P_a$ layer has a carrier concentration lower than that of the p-type $GaAs_{1-a}P_a$ layer, and further has a low-nitrogen-concentration zone, having a nitrogen concentration lower than that of the first nitrogen-doped zone, formed so as to be adjacent to such first nitrogen-doped zone.

4. A light emitting element device comprising:
   a p-n junction portion responsible for light emission formed between a p-type $GaAs_{1-a}P_a$ layer (where a represents mixed crystal ratio and satisfies a relation of $0.45 \leq a \leq 1.0$) and an n-type $GaAs_{1-a}P_a$ layer (where a represents mixed crystal ratio and satisfies a relation of $0.45 \leq a \leq 1.0$); and
   a first nitrogen-doped zone formed in the n-type $GaAs_{1-a}P_a$ layer so as to include the p-n junction interface,
   wherein the n-type $GaAs_{1-a}P_a$ layer has a carrier concentration lower than that of the p-type of $GaAs_{1-a}P_a$ layer, and further has a low-nitrogen-concentration zone, having a nitrogen concentration lower than that of the first nitrogen-doped zone, formed so as to be adjacent to such first nitrogen-doped zone.

5. The light emitting element according to claim 3, wherein also the p-type $GaAs_{1-a}P_a$ layer has a low-nitrogen-concentration zone, having a nitrogen concentration lower than that of the first nitrogen-doped zone, formed so as to be adjacent to such first nitrogen-doped zone.

6. The light emitting element according to claim 4, wherein also the p-type $GaAs_{1-a}P_a$ layer has a low-nitrogen-concentration zone, having a nitrogen concentration lower than that of the first nitrogen-doped zone, formed so as to be adjacent to such first nitrogen-doped zone.

7. The light emitting element according to claim 3, wherein the first nitrogen-doped zone has a nitrogen concentration within a range from $1.33 \times 10^{18}$ atoms/cm$^3$ to $5.56 \times 10^{18}$ atoms/cm$^3$, and the low-nitrogen-concentration zone is a second nitrogen-doped zone having a nitrogen concentration within a range from $1.06 \times 10^{18}$ atoms/cm$^3$ to $5.28 \times 10^{18}$ atoms/cm$^3$.

8. The light emitting element according to claim 4, wherein the first nitrogen-doped zone has a nitrogen concentration within a range from $1.33 \times 10^{18}$ atoms/cm$^3$ to $5.56 \times 10^{18}$ atoms/cm$^3$, and the low-nitrogen-concentration zone is a second nitrogen-doped zone having a nitrogen concentration within a range from $1.06 \times 10^{18}$ atoms/cm$^3$ to $5.28 \times 10^{18}$ atoms/cm$^3$.

9. The light emitting element according to claim 3, wherein the first nitrogen doped zone has a portion residing in the n-type $GaAs_{1-a}P_a$ layer in a thickness of 1 μm to 50 μm.

10. The light emitting element according to claim 4, wherein the first nitrogen doped zone has a portion residing in the n-type $GaAs_{1-a}P_a$ layer in a thickness of 1 μm to 50 μm.

11. The light emitting element according to claims 3, wherein the p-type $GaAs_{1-a}P_a$ layer is formed by diffusing Zn from the major surface opposite to the p-n junction interface; and
   the first nitrogen-doped zone is formed so as to extend over the n-type $GaAs_{1-a}P_a$ layer and the p-type $GaAs_{1-a}P_a$ layer.

12. The light emitting element according to claim 4, wherein the p-type $GaAs_{1-a}P_a$ layer is formed by diffusing Zn from the major surface opposite to the p-n junction interface; and
   the first nitrogen-doped zone is formed so as to extend over the n-type $GaAs_{1-a}P_a$ layer and the p-type of $GaAs_{1-a}P_a$ layer.

13. The light emitting element according to claim 5, wherein the p-type $GaAs_{1-a}P_a$ layer is formed by diffusing Zn from the major surface opposite to the p-n junction interface; and
   the first nitrogen-doped zone is formed so as to extend over the n-type $GaAs_{1-a}P_a$ layer and the p-type $GaAs_{1-a}P_a$ layer.

14. The light emitting element according to claim 6, wherein the p-type $GaAs_{1-a}P_a$ layer is formed by diffusing Zn from the major surface opposite to the p-n junction interface; and
   the first nitrogen-doped zone is formed so as to extend over the n-type $GaAs_{1-a}P_a$ layer- and the p-type of $GaAs_{1-a}P_a$ layer.

15. The light emitting element according to claim 11, wherein the first nitrogen doped zone has a portion residing in the p-type $GaAs_{1-a}P_a$ layer in a thickness of 1 μm to 20 μm.

16. The light emitting element according to claim 12, wherein the first nitrogen doped zone has a portion residing in the p-type $GaAs_{1-a}P_a$ layer in a thickness of 1 μm to 20 μm.

17. The light emitting element according to claim 13, wherein the first nitrogen doped zone has a portion residing in the p-type $GaAs_{1-a}P_a$ layer in a thickness of 1 μm to 20 μm.

18. The light emitting element according to claim 14, wherein the first nitrogen doped zone has a portion residing in the p-type $GaAs_{1-a}P_a$ layer in a thickness of 1 μm to 20 μm.

* * * * *

UNITED STATES PATENT AND TRADEMARK OFFICE
CERTIFICATE OF CORRECTION

PATENT NO. : 6,781,158 B2
DATED : August 24, 2004
INVENTOR(S) : Akio Nakamura et al.

It is certified that error appears in the above-identified patent and that said Letters Patent is hereby corrected as shown below:

Column 10,
Line 66, delete "$Y_p$," and substitute therefore -- $Y_p$ --

Column 12,
Line 18, delete "of"
Line 32, delete "layer-" and substitute therefore -- layer --
Line 32, delete "of"

Signed and Sealed this

First Day of February, 2005

JON W. DUDAS
*Director of the United States Patent and Trademark Office*